United States Patent
Fary et al.

(10) Patent No.: US 12,401,360 B2
(45) Date of Patent: Aug. 26, 2025

(54) LEAKAGE-BASED STARTUP CIRCUIT

(71) Applicant: STMicroelectronics International N.V., Geneva (CH)

(72) Inventors: Federico Fary, Pontey (IT); Sandro Rossi, Pavia (IT); Niccolo Brambilla, San Donato Milanese (IT); Giovanni Sicurella, Catania (IT)

(73) Assignee: STMicroelectronics International N.V., Geneva (CH)

( * ) Notice: Subject to any disclaimer, the term of this patent is extended or adjusted under 35 U.S.C. 154(b) by 39 days.

(21) Appl. No.: 18/224,370

(22) Filed: Jul. 20, 2023

(65) Prior Publication Data
US 2025/0030417 A1  Jan. 23, 2025

(51) Int. Cl.
*H03K 17/687* (2006.01)
*G05F 1/46* (2006.01)

(52) U.S. Cl.
CPC ........... *H03K 17/687* (2013.01); *G05F 1/461* (2013.01)

(58) Field of Classification Search
CPC .............. H03K 17/687; H03K 17/693; H03K 17/6871; H03K 17/6872; H03K 17/6874; H03K 3/02335; H03K 3/2865; H03K 19/003; H03K 19/00315; G05F 1/10; G05F 1/46; G05F 1/461
See application file for complete search history.

(56) References Cited

U.S. PATENT DOCUMENTS

| | | | |
|---|---|---|---|
| 8,177,426 B2 | 5/2012 | Guo et al. | |
| 8,339,117 B2 | 12/2012 | Sicard | |
| 9,195,924 B2 | 11/2015 | Wu et al. | |
| 9,710,010 B2 | 7/2017 | Shen et al. | |
| 11,269,368 B2 | 3/2022 | Al-Shyoukh et al. | |
| 2007/0146048 A1 | 6/2007 | Debroux | |
| 2011/0193544 A1* | 8/2011 | Iacob | G05F 3/242 323/315 |
| 2015/0153758 A1 | 6/2015 | Huang | |
| 2019/0235559 A1 | 8/2019 | Dashtestani et al. | |

FOREIGN PATENT DOCUMENTS

CN  105511540 B  5/2017

\* cited by examiner

*Primary Examiner* — Jung Kim
(74) *Attorney, Agent, or Firm* — Crowe & Dunlevy LLC

(57) ABSTRACT

A startup circuit includes a first circuit leg coupled between an input node and an output node and a second circuit leg coupled between the input node and the output node. The first circuit generates a first current and the second circuit leg sinks current from a first node based upon the first current. A third circuit leg is coupled between the input node and the output node and sources current to a second node based upon a voltage at the first node to thereby generate a feedback voltage at the second node. The first circuit leg increases the first current based upon the feedback voltage, in turn increasing the current sunk from the first node by the second circuit leg and increasing the current sourced to the second node by the third circuit leg to thereby generate a startup current at the output node.

13 Claims, 4 Drawing Sheets

LEAKAGE-BASED STARTUP CIRCUIT

TECHNICAL FIELD

This disclosure is related to the startup of integrated circuits and, in particular, to a circuit for performing startup of an integrated circuit in a fashion that is unaffected by temperature, supply voltage, or variation between devices.

BACKGROUND

When an integrated circuit (IC) device is powered up by a battery, it enters a startup phase. This period is characterized by the provision of desired biasing points, voltages, and currents to various internal nodes. The objective during this startup phase is to prevent potential problems that might occur during the ramp-up of the supply voltage, which could trap the circuit in an undesired operating state.

Leakage currents play a significant role in charging the internal nodes of the IC during the startup phase. However, these currents can exhibit variations depending on process parameters, corner cases, and operating temperature. This variability may interfere with the consistent and accurate establishment of biasing, leading to potential device reliability issues during the startup phase. Still further, the models for leakage current used in existing simulations may be inaccurate. Measurement noise during device characterization can distort the models and therefore the simulated results, leading to incorrect estimates of the leakage currents. Thus, a startup circuit topology that relies not only on leakage but is also robust against these variations is necessary.

A first known startup circuit, as shown in FIG. 1, includes a resistor connected between the input voltage VIN (e.g., battery voltage) and a node Ng. The startup circuit also includes a Zener diode Dz, with its cathode connected to node Ng and its anode connected to ground. A power transistor T, which supplies power from the input voltage to the load circuits within the IC, has its gate controlled by the voltage VZ present at node Ng. During startup, a startup current I_startup flows through the resistor R to form the voltage VZ at node Ng.

The issue with this first known startup circuit is that it is to provide for proper startup across the entire possible supply voltage VIN range. For certain high voltage applications, this range can be wide. Therefore, the resistor R needs to be small enough to provide sufficient startup current I_startup to establish the correct voltage VZ at the appropriate ramp rate. Simultaneously, it should be large enough to limit power dissipation when the supply voltage VIN is high. If the supply voltage VIN is substantial, the resistor R is physically large, consuming an undesirably large area.

A second known startup circuit, as illustrated in FIG. 2, includes a diode with its cathode connected to the input voltage VIN and its anode connected to node Ng. The Zener diode Dz has its cathode connected to node Ng and its anode connected to ground. The power transistor T has its gate controlled by the voltage VZ present at node Ng. During startup, the startup current I_startup flows through the diode D to form voltage VZ at node Ng.

The problem with this second known startup circuit is that the leakage current through the diode D is highly sensitive to process, voltage, and temperature variations. As a result, determining the proper size for the diode D to allow for sufficient startup current I_startup at process corners is challenging, especially given the limitations of existing models of MOS diodes.

Therefore, further development is needed to provide for reliable startup functionality across process variations and regardless of the magnitude of the startup current. The objective of such development is therefore to overcome the constraints imposed by process, corner, and temperature dependencies and the inaccuracies of leakage current simulations, without consuming excessive device area.

SUMMARY

Disclosed herein is a startup circuit, including a startup current circuit. The startup current circuit includes a first circuit leg coupled between an input node and an output node, the first circuit leg configured to generate a first current, a second circuit leg coupled between the input node and the output node, the second circuit leg configured to sink current from a first node based upon the first current, and a third circuit leg coupled between the input node and the output node, the third circuit leg configured to source current to a second node based upon a voltage at the first node to thereby generate a feedback voltage at the second node. The first circuit leg is configured to increase the first current based upon the feedback voltage, in turn increasing the current sunk from the first node by the second circuit leg and increasing the current sourced to the second node by the third circuit leg to thereby generate a startup current at the output node.

The first circuit leg may include a diode coupled transistor connected between the input node and a third node, a first mirror transistor connected between the third node and the output node and having a control terminal connected to the third node, and a feedback transistor connected between the input node and the third node and having a control terminal coupled to receive the feedback voltage.

The diode coupled transistor and first mirror transistor may be n-channel transistors, with the diode coupled transistor having its drain connected to the input node, its source connected to the third node, and its gate connected to the third node, and with the first mirror transistor having its drain connected to the third node, its source connected to ground, and its gate connected to the third node. The feedback transistor may be an n-channel transistor having its drain connected to the input node, its source connected to the third node, and its gate connected to the second node.

The diode coupled transistor and first mirror transistor may be n-channel transistors, with the diode coupled transistor having its drain connected to the input node, its source connected to the third node, and its gate connected to the third node, and with the first mirror transistor having its drain connected to the third node, its source connected to ground, and its gate connected to the third node. The feedback transistor may be a p-channel transistor having its source connected to the input node, its drain connected to the third node, and its gate connected to the second node.

The second circuit leg may include a second mirror transistor connected between the input node and the first node and having a control terminal connected to the first node, a sink transistor connected between the first node and the output node and having a control terminal connected to the first node, and a third mirror transistor connected between the first node and the output node through a resistor and having a control terminal connected to the third node.

The second mirror transistor and sink transistor may be p-channel transistors, with the second mirror transistor having its source connected to the input node, its drain connected to the first node, and its gate connected to the first node, and with the sink transistor having its source connected to the first node, its drain connected to ground, and its gate connected to the first node. The third mirror transistor may be an n-channel transistor having its drain connected to the first node, its source coupled to ground through the resistor, and its gate connected to the third node.

The third circuit leg may include a fourth mirror transistor connected between the input node and the second node and having a control terminal connected to the first node, the fourth mirror transistor being in a current mirror relationship with the second mirror transistor, and a fifth mirror transistor connected between the second node and ground and having a control terminal connected to the third node, the fifth mirror transistor being in a current mirror relationship with the first mirror transistor.

The fourth mirror transistor may be a p-channel transistor having its source connected to the input node, its drain connected to the second node, and its gate connected to the first node, and the fifth mirror transistor may be an n-channel transistor having its drain connected to the second node, its source connected to ground, and its gate connected to the first node.

A power transistor may be connected between the input node and ground through a load, the power transistor having a control terminal connected to the output node. A Zener diode may have its cathode connected to the output node and an anode connected to ground.

A mirror transistor may be connected between the input node and a control node, the mirror transistor having a control terminal connected to the first node. A Zener diode may have its cathode connected to the control node and its anode connected to the output node, the output node being connected to ground. A power transistor may be connected between the input node and ground through a load, the power transistor having a control terminal connected to the control node.

Also disclosed herein is a startup circuit including a startup current circuit. The startup current circuit includes a diode coupled transistor connected between an input node and a third node, a feedback transistor connected between the input node and a first node and having a control terminal coupled to receive a feedback voltage at a second node, a first current mirror having an input connected to the third node and an output connected to the second node, a second current mirror having an input connected to the first node and an output connected to the second node, a first sink transistor connected between the first node and an output node through a resistor and having a control terminal connected to a control node of the first current mirror, and a second sink transistor connected between the first node and the output node and having a control terminal connected to the first node.

The first current mirror may include a first n-channel transistor having its drain connected to the third node, its source connected to the output node, and its gate connected to the third node; and a second n-channel transistor having its drain connected to the second node, its source connected to the output node, and its gate connected to the third node.

The feedback transistor may be an n-channel transistor having its drain connected to the input node, its source connected to the third node, and its gate connected to the second node.

The feedback transistor may be a p-channel transistor having its source connected to the input node, its drain connected to the third node, and its gate connected to the second node.

The second current mirror may include a first p-channel transistor having its source connected to the input node, its drain connected to the first node, and its gate connected to the first node; and a second p-channel transistor having its source connected to the input node, its drain connected to the second node, and its gate connected to the first node.

The first sink transistor may be an n-channel transistor having its drain connected to the first node, its source connected to the output node through the resistor, and its gate connected to the control node of the first current mirror.

The second sink transistor may be a p-channel transistor having its source and gate connected to the first node and its drain connected to the output node.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 3:
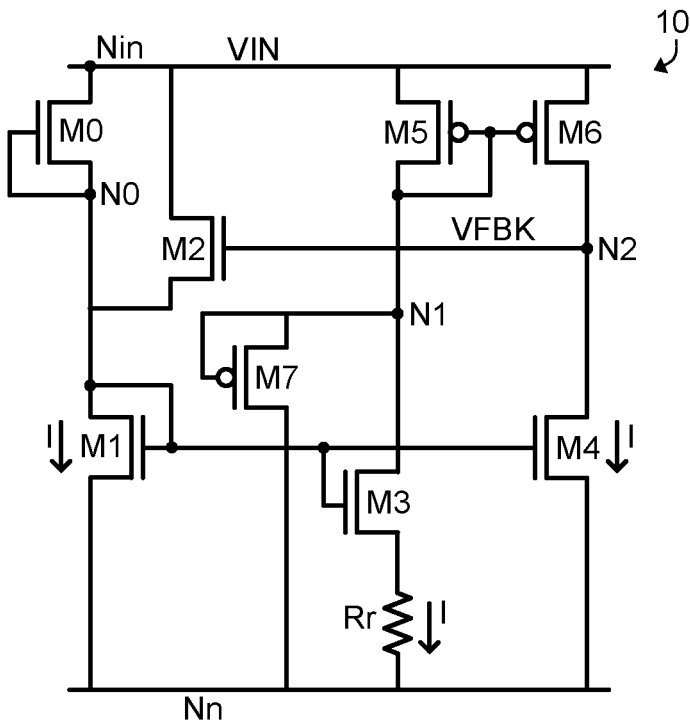
FIG. 3 is a schematic diagram of a startup current circuit disclosed herein.
Figure 3A:
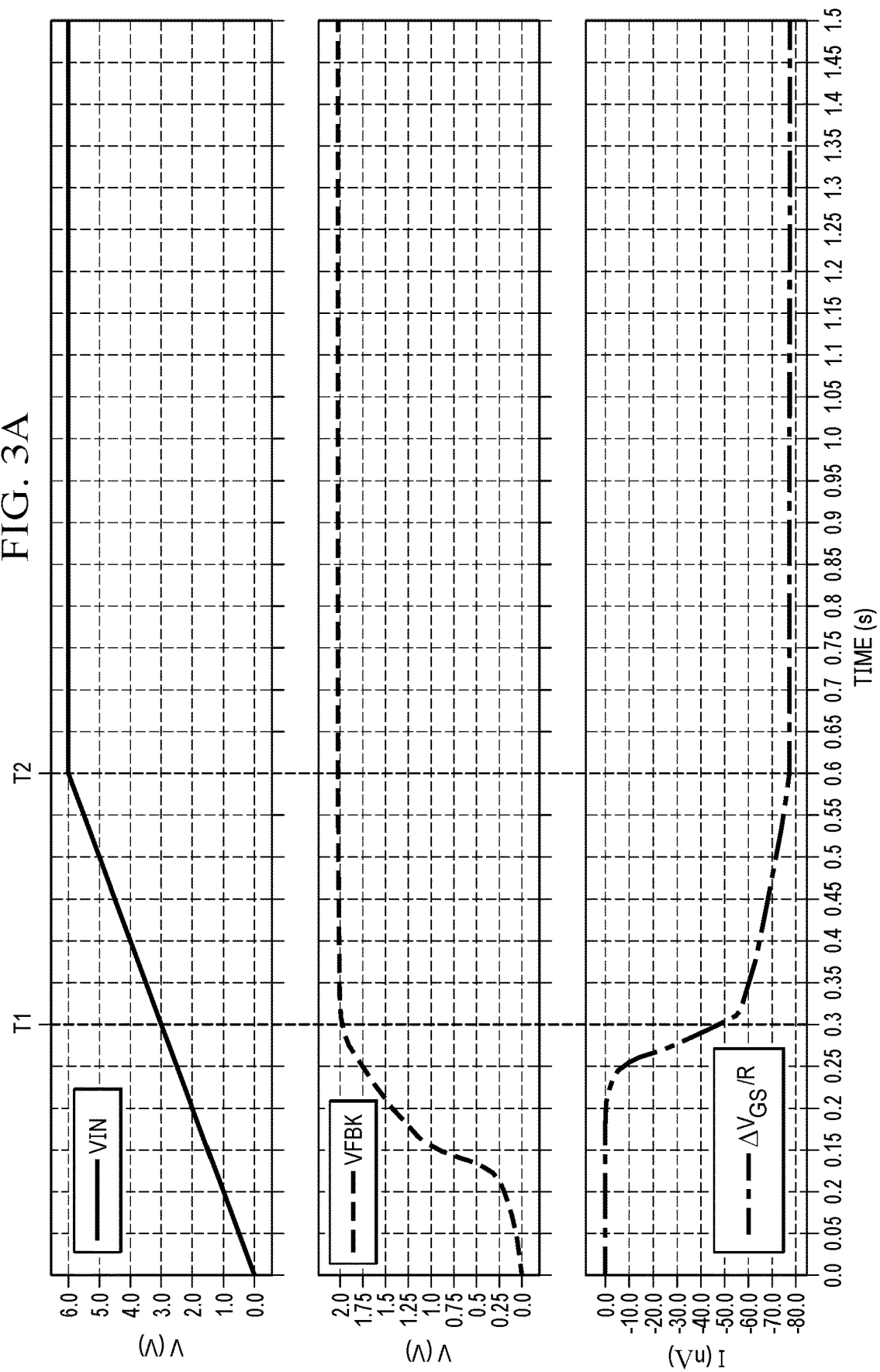
FIG. 3A is a graph showing voltages of the startup current circuit of FIG. 3 during operation.

With reference to FIGS. 3 and 3A, now described is a startup current circuit 10. The startup current circuit 10 includes a high voltage n-channel transistor M0 (e.g., a transistor able to sustain the supply voltage VIN as its drain to source voltage, with VIN being on the order of tens to hundreds of volts) having its drain connected to an input voltage node Nin and its source and gate connected to node N0 (e.g., transistor M0 being diode coupled), and a high voltage n-channel transistor M1 having its drain and gate connected to node N0 and its source connected to node Nn (e.g., transistor M1 being diode coupled). A high voltage n-channel transistor M2 has its drain connected to node Nin, its source connected to node N0, and its gate connected to node N2 to receive a feedback voltage VFBK therefrom. N-channel transistors M0, M1, and M2 are matched (e.g., same MOS type, same dimensions).

In addition, a high voltage p-channel transistor M7 has its source and gate connected to node N1 and its drain connected to node Nn. A high voltage p-channel transistor M5 has its source connected to node Nin and its drain and gate connected to node N1, and a high voltage p-channel transistor M6 has its source connected to node Nin and its drain and gate connected to node N2. P-channel transistors M5, M6, and M7 are matched (e.g., same MOS type, same dimensions).

A high voltage n-channel transistor M3 has its drain connected to node N1, its source coupled to node Nn through resistor Rr, and its gate connected to node N0. A high voltage n-channel transistor M4 has its drain connected to node N2, its source connected to node Nn, and its gate connected to node N0.

As the supply voltage VIN rises, as shown in FIG. 3A prior to time T2, the drain to source voltage VDS across n-channel transistors M0 and M2 (which are in parallel) begins to increase. Conversely, at startup, the VDS across n-channel transistor M1 is zero. Since n-channel transistors M0, M1, and M2 are matched (meaning their leakage currents for a same given VDS are the same), the leakage current flowing from the supply node Nin through n-channel transistors M0 and M2 in parallel is larger than the leakage current across the n-channel transistor M1, which can be mathematically represented as:

$$I_{leak_{M0}} + I_{leak_{M2}} > I_{leak_{M1}}$$

As a consequence of this inequality, the voltage at node N0 rises, beginning to increase the gate to source VGS voltage of n-channel transistor M1 in a way that is compensated for process or temperature variations in the leakage currents $I_{leak_{M0}}$, $I_{leak_{M2}}$, and $I_{leak_{M1}}$ due to the matching of the n-channel transistors M0, M1, and M2.

As the VGS voltage of n-channel transistor M1 increases, a leakage current $I_{leak_{M1}}$ begins to flow therethrough, and this current is replicated through the n-channel transistors M3 and M4 because they are in a current mirroring arrangement with n-channel transistor M1. As transistor M7 is p-channel, the leakage current sunk $I_{leak_{M3}}$ from node N1 by n-channel transistor M3 serves to begin to turn on transistor M7. Since p-channel transistors M7 and M5 are matched, this means that the leakage current $I_{leak_{M5}}$ flowing from the supply Nin through p-channel transistor M5 is smaller than the leakage current flowing through the parallel combination of p-channel transistor M7 and n-channel transistor M3, which can be mathematically represented as:

$$I_{leak_{M7}} + I_{leak_{M3}} > I_{leak_{M5}}$$

As a consequence of this inequality, the voltage at node N1 continues to fall, beginning to increase the gate to source voltage of p-channel transistor M5 and therefore the leakage current through M5. Since p-channel transistors M5 and M6 are in a current mirroring relationship, this leakage current is then replicated in transistor M6. Notice that gate voltage of p-channel transistor M6 (and therefore its gate to source voltage VGS) is defined by the voltage at node N1, which in turn is influenced by the leakage currents through p-channel transistor M7 and n-channel transistor M3.

As a result therefore, the voltage VFBK at node N2 begins to rise, as shown in FIG. 3A prior to time T1, closing the feedback loop with n-channel transistor N2, setting a gate to source voltage VGS across n-channel transistor M2. This increase in the current through n-channel transistor M2 increases the voltage at node N0, and therefore the gate to source voltage VGS of n-channel transistor M1. Increasing the VGS of n-channel transistor M1 in turn increases the VGS of n-channel transistors M3 and M4. At this point, the startup current circuit 10 therefore enters a non-leakage regime in which the current I flowing through n-channel transistor M3 will be controlled by the following relationship:

$$I = \frac{2}{k'\left(\frac{W}{L}\right)_{M4}} * \left(1 - \frac{1}{\sqrt{\alpha}}\right)^2 * \frac{1}{R^2} \sim \Delta V_{gs\,M3/M4}/R$$

Here, α=0.5, which is the mirroring ratio between n-channel transistor M3 and M4, and $\Delta V_{gs\,M3/M4}$ is the difference between the gate to source voltages VGS of transistors M3 and M4. Thus, the current I through n-channel transistor M3 is not dependent on the input voltage VIN, and is instead dependent upon the resistance of the resistor Rr and the dimensions of the n-channel transistors M3 and M4, as shown in FIG. 3A after time T2

Figure 6:
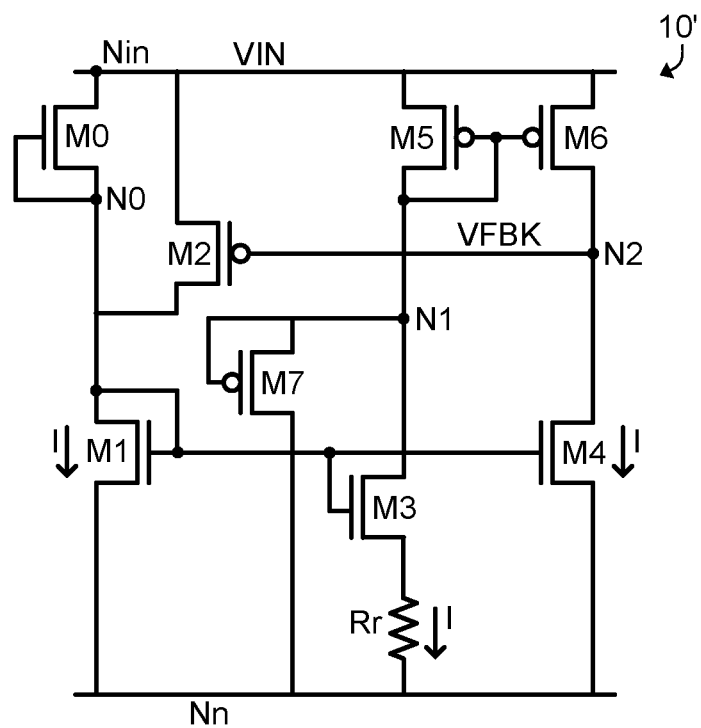
FIG. 6 is a schematic diagram of an alternative startup current circuit.

This startup current circuit 10 can be modified, for example, as shown in FIG. 6, in which transistor M2 is a p-channel transistor, allowing for effective startup performance even at lower supply voltages.

The design of the startup current circuit 10 helps ensure that the startup current, to the first approximation, remains uninfluenced by supply voltage VIN, manufacturing process, and temperature. This reduces both power consumption and area occupancy, thereby providing for consistent startup functionality under a variety of conditions. Furthermore, the startup current circuit 10 design maximizes efficiency in component use as it employs high voltage (HV) transistors M0-M6 but a low-voltage resistor Rr (e.g., a resistor having a safe operating voltage range lower than VIN, such as 1.9V, 3.3V, or 5V). Given that HV transistors generally occupy less space than HV resistors, this leads to a reduction in area occupancy for the same power consumption. This reduces area consumption while maintaining power efficiency. Lastly, another advantage in the design of the startup current circuit 10 is that it is independent of the absolute value of the leakage current because the startup functionality relies on the matching of transistors, rendering it immune to variations in device modeling or substantial process changes. By focusing on transistor matching instead of leakage current values, the startup current circuit 10 exhibits a level of operational stability and consistency that surpasses prior art approaches. In summary therefore, the startup current circuit 10 design offers benefits in terms of energy efficiency, space efficiency, and operational stability.

Figure 1:
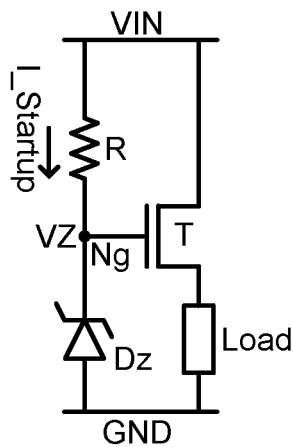
FIG. 1 is a schematic diagram of a first prior art startup circuit.
Figure 4:
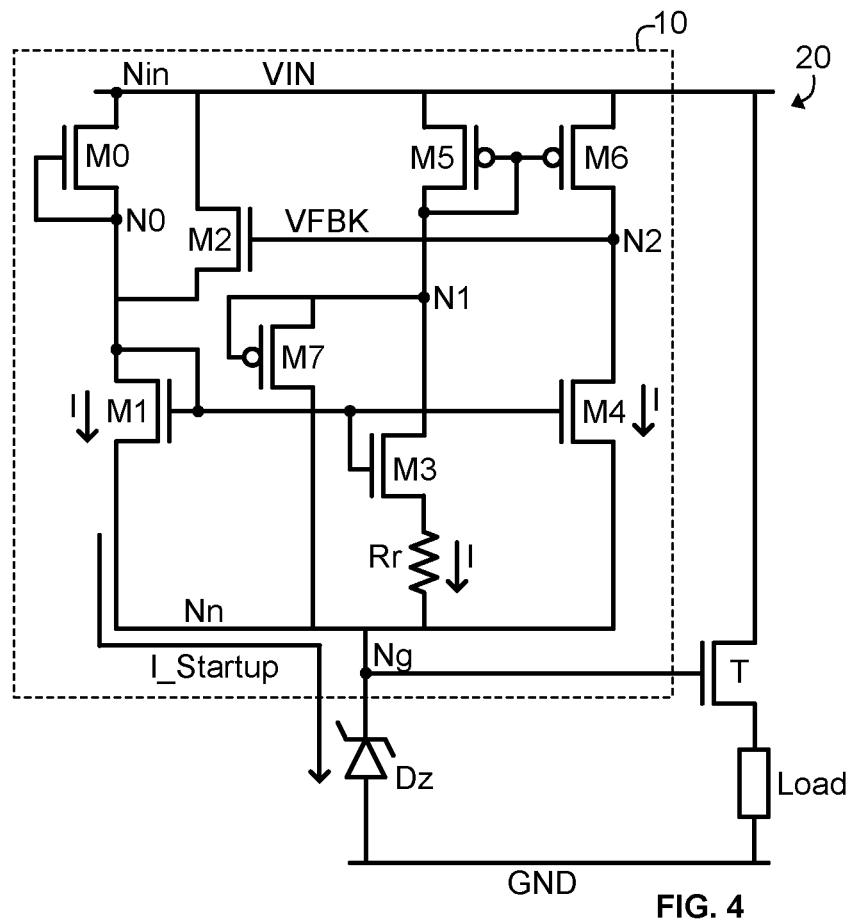
FIG. 4 is a schematic diagram of a first startup circuit disclosed herein incorporating the startup current circuit of FIG. 3.
Figure 5:
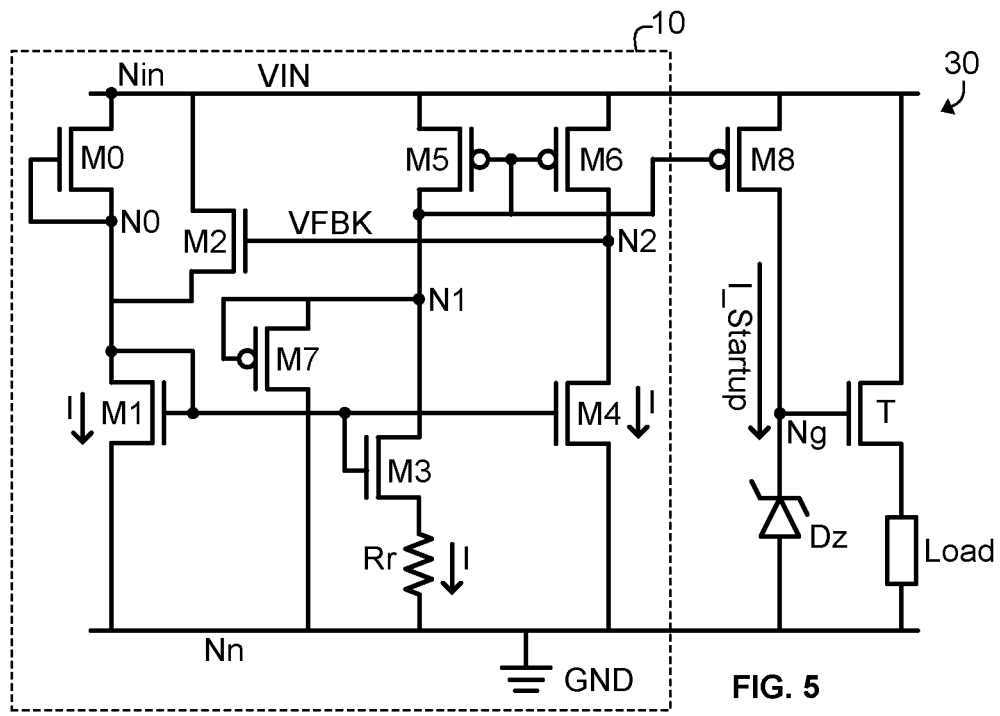
FIG. 5 is a schematic diagram of a second startup circuit disclosed herein incorporating the startup current circuit of FIG. 3.

Example startup circuits employing the startup current circuit 10 are shown in FIGS. 4 and 5. The startup circuit 20 of FIG. 4 corresponds to that of FIG. 1, but with the resistor R replaced with the startup current circuit 10. Therefore here, node Nn of startup current circuit 10 is connected to node Ng of the startup circuit 20, with the drain of power transistor T being connected to node Nin. The source of power transistor T is coupled to ground through the load (e.g., internal circuits), and the gate of the power transistor T is coupled to node Ng. The Zener diode Dz has its cathode connected to node Ng and has its anode connected to ground. This startup circuit 20 is suited to applications where the input voltage VIN is relatively high.

Figure 2:
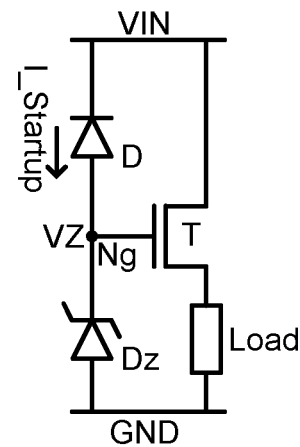
FIG. 2 is a schematic diagram of a first prior art startup circuit.

The startup circuit 30 of FIG. 5 includes a p-channel transistor M8, in a mirroring arrangement with p-channel transistors M5 and M6 and replacing the diode D of FIG. 2, having its source connected to the input node Nin, its drain connected to node Ng, and its gate connected to node N1 of the startup current circuit 10. A Zener diode Dz has its cathode connected to node Ng and its anode connected to ground. The power transistor T has its drain connected to the input node Nin, its source coupled to ground through the load, and its gate connected to node Ng. Node Nn is connected to ground. This startup circuit 30 is suited to applications where the input voltage VIN is relatively low.

Notice therefore that the startup current circuit 10 is usable with startup circuits of a wide input voltage range because it is highly versatile and can be integrated into any high-voltage design where there is a desire for low-power and compact startup current generation. This applicability extends to bandgap and linear voltage regulators, regardless of whether they are directly attached to the supply voltage. These components typically require a startup current to correctly establish the operational point, preventing them from settling at any undesirable stable points. Depending on application details, such as power consumption and area occupancy, the startup current can be adjusted by simply altering the resistance value.

Furthermore, the startup current generated by this startup current circuit 10 can be utilized directly or mirrored multiple times with varying factors, based on the specific design requirements, offering a wide range of current values for different applications.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A startup circuit, comprising:
a first circuit leg coupled between an input node and an output node, the first circuit leg configured to generate a first current;
wherein the first circuit leg comprises:
a diode coupled transistor connected between the input node and a third node;
a first mirror transistor connected between the third node and the output node and having a control terminal connected to the third node; and
a feedback transistor connected between the input node and the third node and having a control terminal coupled to receive a feedback voltage;
a second circuit leg coupled between the input node and the output node, the second circuit leg configured to sink current from a first node based upon the first current; and
a third circuit leg coupled between the input node and the output node, the third circuit leg configured to source current to a second node based upon a voltage at the first node to thereby generate the feedback voltage at the second node;
wherein the first circuit leg is configured to increase the first current based upon the feedback voltage, in turn increasing the current sunk from the first node by the second circuit leg and increasing the current sourced to the second node by the third circuit leg to thereby generate a startup current at the output node.

2. The startup circuit of claim 1,
wherein the diode coupled transistor and first mirror transistor are n-channel transistors, with the diode coupled transistor having its drain connected to the input node, its source connected to the third node, and its gate connected to the third node, and with the first mirror transistor having its drain connected to the third node, its source connected to ground, and its gate connected to the third node; and
wherein the feedback transistor is an n-channel transistor having its drain connected to the input node, its source connected to the third node, and its gate connected to the second node.

3. The startup circuit of claim 1,
wherein the diode coupled transistor and first mirror transistor are n-channel transistors, with the diode coupled transistor having its drain connected to the input node, its source connected to the third node, and its gate connected to the third node, and with the first mirror transistor having its drain connected to the third node, its source connected to ground, and its gate connected to the third node; and
wherein the feedback transistor is a p-channel transistor having its source connected to the input node, its drain connected to the third node, and its gate connected to the second node.

4. The startup circuit of claim 1, wherein the second circuit leg comprises:
a second mirror transistor connected between the input node and the first node and having a control terminal connected to the first node;
a sink transistor connected between the first node and the output node and having a control terminal connected to the first node; and
a third mirror transistor connected between the first node and the output node through a resistor and having a control terminal connected to the third node.

5. The startup circuit of claim 4,
wherein the second mirror transistor and sink transistor are p-channel transistors, with the second mirror transistor having its source connected to the input node, its drain connected to the first node, and its gate connected to the first node, and with the sink transistor having its source connected to the first node, its drain connected to ground, and its gate connected to the first node; and
wherein the third mirror transistor is an n-channel transistor having its drain connected to the first node, its source coupled to ground through the resistor, and its gate connected to the third node.

6. The startup circuit of claim 4, wherein the third circuit leg comprises:
a fourth mirror transistor connected between the input node and the second node and having a control terminal connected to the first node, the fourth mirror transistor being in a current mirror relationship with the second mirror transistor; and
a fifth mirror transistor connected between the second node and ground and having a control terminal connected to the third node, the fifth mirror transistor being in a current mirror relationship with the first mirror transistor.

7. The startup circuit of claim 6,
wherein the fourth mirror transistor is a p-channel transistor having its source connected to the input node, its drain connected to the second node, and its gate connected to the first node; and
wherein the fifth mirror transistor is an n-channel transistor having its drain connected to the second node, its source connected to ground, and its gate connected to the first node.

8. The startup circuit of claim 1, further comprising:
a power transistor connected between the input node and ground through a load, the power transistor having a control terminal connected to the output node; and
a Zener diode having its cathode connected to the output node and an anode connected to ground.

9. A startup circuit, comprising:
a first circuit leg coupled between an input node and an output node, the first circuit leg configured to generate a first current;
a second circuit leg coupled between the input node and the output node, the second circuit leg configured to sink current from a first node based upon the first current; and
a third circuit leg coupled between the input node and the output node, the third circuit leg configured to source current to a second node based upon a voltage at the first node to thereby generate a feedback voltage at the second node;
wherein the first circuit leg is configured to increase the first current based upon the feedback voltage, in turn increasing the current sunk from the first node by the second circuit leg and increasing the current sourced to the second node by the third circuit leg to thereby generate a startup current at the output node;
a mirror transistor connected between the input node and a control node, the mirror transistor having a control terminal connected to the first node;
a Zener diode having its cathode connected to the control node and its anode connected to the output node, the output node being connected to ground; and
a power transistor connected between the input node and ground through a load, the power transistor having a control terminal connected to the control node.

10. The startup circuit of claim 9, wherein the second circuit leg comprises:
a second mirror transistor connected between the input node and the first node and having a control terminal connected to the first node;
a sink transistor connected between the first node and the output node and having a control terminal connected to the first node; and
a third mirror transistor connected between the first node and the output node through a resistor and having a control terminal connected to a third node.

11. The startup circuit of claim 10,
wherein the second mirror transistor and sink transistor are p-channel transistors, with the second mirror transistor having its source connected to the input node, its drain connected to the first node, and its gate connected to the first node, and with the sink transistor having its source connected to the first node, its drain connected to ground, and its gate connected to the first node; and
wherein the third mirror transistor is an n-channel transistor having its drain connected to the first node, its source coupled to ground through the resistor, and its gate connected to the third node.

12. The startup circuit of claim 4, wherein the third circuit leg comprises:
a fourth mirror transistor connected between the input node and the second node and having a control terminal connected to the first node, the fourth mirror transistor being in a current mirror relationship with the second mirror transistor; and
a fifth mirror transistor connected between the second node and ground and having a control terminal connected to the third node, the fifth mirror transistor being in a current mirror relationship with a first mirror transistor.

13. The startup circuit of claim 12,
wherein the fourth mirror transistor is a p-channel transistor having its source connected to the input node, its drain connected to the second node, and its gate connected to the first node; and
wherein the fifth mirror transistor is an n-channel transistor having its drain connected to the second node, its source connected to ground, and its gate connected to the first node.

* * * * *